United States Patent [19]

Hiratani et al.

[11] Patent Number: 5,151,409

[45] Date of Patent: Sep. 29, 1992

[54] SUPERCONDUCTING COMPOSITION COMPRISING LN-TH-CU-O, WHEREIN LN IS PR, ND, PM, SM, EU, GD, ER OR MIXTURES THEREOF

[75] Inventors: Masahiko Hiratani, Akishima; Shin'ichiro Saitoh, Tokyo; Katsuki Miyauchi, Hino; Tsuyoshi Seko, Higashimurayama, all of Japan

[73] Assignee: Hitachi, Ltd., Tokyo, Japan

[21] Appl. No.: 469,225

[22] Filed: Jan. 24, 1990

[30] Foreign Application Priority Data

| Jan. 27, 1989 | [JP] | Japan | 1-016141 |
| Jan. 27, 1989 | [JP] | Japan | 1-016142 |
| Jan. 27, 1989 | [JP] | Japan | 1-016143 |
| Feb. 17, 1989 | [JP] | Japan | 1-036128 |
| Mar. 3, 1989 | [JP] | Japan | 1-049827 |
| Mar. 10, 1989 | [JP] | Japan | 1-056418 |

[51] Int. Cl.$^5$ .............. C01B 13/00; C01F 15/00; C01G 3/02; H01L 39/12
[52] U.S. Cl. .............. 505/1; 252/518; 252/521; 423/604; 505/776; 505/779
[58] Field of Search .............. 505/1, 776, 779; 252/518, 521; 423/604

[56] References Cited

FOREIGN PATENT DOCUMENTS 57-176780 10/1982 Japan.

OTHER PUBLICATIONS

Z. anorg. allg. Chem., 428 (1977), pp. 120–124.
Z. anorg. allg. Chem., 414 (1975), pp. 76–80.
JETP Lett., vol. 22, No. 11, Dec. 5, 1975, pp. 274–277.
Tsurumi "Appearance of Superconductivity in Tetragonal NdBaCuO" Jap. Jnl. Appl. Physic. vol. 77(3) Mar. 1988 pp. L397–L399.
Yuling "Thermal Characterization and Superconductivity..." Int'l J. of Modern Physiol. vol. 1 (2), 1987 pp. 257–261.
Sawa "Unusually Simple Crystal Structure of Nd–Ce–Sr–Cu–O..." Nature vol. 337 Jan. 26, 1989 pp. 347–318.
Markert "High Temperature Superconductivity in Th–Doped $Nd_2CuO_{4-y}$" Solid State Comm. vol. 70(2) Apr. 1989 pp. 145–147.
Huang et al. "X-Ray Powder Diffraction Analysis of the $Nd_{2-x}Th_xCuO_4$" Mat. Res. Bull. vol. 24 Jul. 1989 pp. 875–881.
Tranquada "Nature of the Charge Carriers in Electron-Doped..." Nature vol. 337 Feb. 23, 1989 pp. 720–721.
Tokura "A Superconducting Copper Oxide Compound w/Electrons..." Nature vol. 337 Jan. 26, 1989 pp. 345–347.

Primary Examiner—Paul Lieberman
Assistant Examiner—John Boyd
Attorney, Agent, or Firm—Kenyon & Kenyon

[57] ABSTRACT

A superconducting oxide composition comprising Ln-Th-Cu-O wherein Ln indicates at least one element selected from a group consisting of Pr, Nd, Pm, Sm, Eu, Gd and Er. A superconducting structure is formed in such a manner that at least an insulating layer is sandwiched between two superconductor layers but the superconductor layers are electrically coupled with each other, and a superconducting device including the superconducting structure is constructed so as to perform a switching operation for an electric signal, to detect a light signal, and to detect the intensity of a magnetic field. Another superconducting device is formed so that two superconductor layers are put in direct contact with each other, and a tunnel current between the superconductor layers can be controlled. Further, a superconductor structure is formed which includes a plurality of superconductor layers and has a superconducting transition temperature or superconducting critical current higher than that of each superconductor layer, and a superconducting device including this superconducting structure can operate at a relatively high temperature. Furthermore, a superconducting circuit device is formed which can emit a coherent electromagnetic wave having a wavelength of the order of 10 $\mu$m on the basis of the difference in energy gap between adjacent superconductor layers. Additionally, novel oxide superconductor materials are disclosed.

3 Claims, 7 Drawing Sheets

SUPERCONDUCTING COMPOSITION COMPRISING LN-TH-CU-O, WHEREIN LN IS PR, ND, PM, SM, EU, GD, ER OR MIXTURES THEREOF

BACKGROUND OF THE INVENTION

The present invention relates to a superconducting structure, a superconducting device using the above structure, and a superconductive material used in the superconducting device.

A pn junction superconducting device using two superconductors of the p- and n-conductive types has been well known (refer to, for example, JP-A-57-176780 laid open on Oct. 30, 1982). In this prior art, two superconductors are kept indirect contact with each other, to form a superconducting device, and a superconducting tunnel current is generated not by the superconducting proximity effect but by the tunnel effect.

Meanwhile, Cu-oxide superconductors which have hitherto been found, have a crystal structure belonging to perovskite and modified versions thereof. The perovskite structure and the modified versions include the following structures. In the first structure, the octahedral arrangement of oxygen atoms with a copper atom at the center is used as the polyhedron formed of copper and oxygen atoms. In the second structure, one or two oxygen atoms are removed from the octahedral arrangement of oxygen atoms to form a square pyramidal arrangement or square planar arrangement. In the third structure, the octahedral arrangement, square pyramidal arrangement and square planar arrangement are piled. In these structures, when the atomic coordinates of a copper atom are expressed by (0, 0, 0), oxygen atoms are disposed in the vicinity of each of three positions expressed by atomic coordinates ($\frac{1}{2}$, 0, 0), (0, $\frac{1}{2}$, 0), and (0, 0, Z), where Z$\neq$0.

Although the mechanism of superconductivity in Cu-oxide superconductors has not yet been clarified, square planar arrangement of oxygen atoms is two-dimensionally repeated in the crystal structures of Cu-oxide superconductors so as to form a Cu-O plane. Compounds which can be used as a Cu-oxide superconductor, are described in the following publications:

B. Grande, Hk. Muller - Buschbaum and M. Schweizer, Z. anorg. allg. Chem., 428 (1977) 120.

Hk. Muller-Buschbaum and W. Wollschlager, Z. anorg. allg. Chem., 414 (1975) 76.

SUMMARY OF THE INVENTION

In the prior art with respect to a superconducting device, a superconductive material of the p-conductive type and a superconductive material of the n-conductive type are kept in direct contact with each other, to form a pn junction, thereby obtaining a pn junction superconducting device. The prior art, however, pays no attention to problems which are aroused by putting the material of the p-conductive type in direct contact with the material of the n-conductive type, such as mutual diffusion and segregation. Accordingly, the materials are deteriorated by the heat treatment in a fabricating step, and the characteristics of the superconducting device degrade with time. Thus, it is impossible for the device to have sufficiently stable characteristics.

Further, each of the superconductive material of the p-conductive type and the superconductive material of the n-conductive type can be used only in a limited range of carrier concentration. Thus, it is impossible to vary the characteristics of the pn junction between these materials in a great degree by changing the carrier concentrations of these materials. That is, the difference between the upper and lower limits of a current flowing through the unit area of the pn junction is small. Accordingly, the device is unsatisfactory from the practical point of view.

In addition to the above problems which are aroused by putting two superconductive materials in direct contact with each other, a different problem arises in the prior art. That is, if the superconducting device is once fabricated, a superconducting tunnel current is fixed to a constant value. In other words, the superconducting tunnel current can be controlled by an external magnetic signal, but cannot be controlled directly by an electric signal. In short, the device can perform only a diode-like operation, and thus it is difficult to form a superconducting circuit of the device. Accordingly, it is difficult to form a large scale integration circuit by using the device.

Further, in the prior art, a current is forced to flow across the boundary between two superconductors, and the voltage dependence of the current is utilized in fabricating a superconducting device. Accordingly, the operation temperature of the superconducting device is determined by the superconducting transition temperature of the superconductors. For example, in a case where niobium is used as a superconductor, the upper limit of the operation temperature is 9° K. In a case where oxide superconductors are used, the operation temperature is determined by the lower one of the superconducting transition temperatures of an oxide superconductor of the p-conductive type and an oxide superconductor of the n-conductive type, that is, the operation temperature is 20° K. at the highest.

The first object of the present invention is to provide a superconducting structure which employs a superconductive material and has stable characteristics, and to provide a superconducting device using the structure.

The second object of the present invention is to provide a superconducting device of the transistor type which device can control the value of a superconducting tunnel current due to the tunnel effect.

The third object of the present invention is to provide a superconducting structure capable of exhibiting superconductivity at a temperature higher than an ordinary superconducting transistion temperature, and to provide a superconducting device using the above structure.

The fourth object of the present invention is to provide a superconducting circuit device which is small in size and can generate a coherent electromagnetic wave having a wavelength of the order of 10 $\mu$m.

The fifth object of the present invention is to provide an oxide superconductor material which is considered to have a novel mechanism of superconductivity.

Other objects of the present invention will become apparent from the following explanation.

According to an aspect of the present invention, there is provided a superconducting structure, in which a first thin film made of a superconductor of the p-conductive type and a second thin film made of a superconductor of the n-conductive type are electrically coupled so that a current can flow between first and second thin films, without putting the second thin film in direct contact with the first thin film. In other words, a third layer with a thickness capable of generating the tunnel phenomenon is interposed between the first and second thin films. An insulating layer or semiconductor layer having a depletion layer is used as the third layer. The third layer prevents the diffusion of a constituent element from one of the first and second thin films into the other thin film, and prevents the degradation of the thin films and the aging of the structure.

In a case where a superconducting device is formed by using the above structure, one of the first and second thin films is used as means for injecting quasi particles into the other than film, and the insulating layer or the depletion layer of the semiconductor layer is formed so as to be able to transmit carriers by the tunnel effect. Further, means for irradiating the depletion layer with light, or means for applying a magnetic field to the depletion layer is provided. In a case where the first and second thin films are made equal in conductive type to each other, the first thin film is made of an oxide superconductor material, and the second thin film is made of a material having normal conductivity (for example, a metal or semiconductor). In this case, the superconductivity of the first thin film is diffused into at least a portion of the second thin film.

According to another aspect of the present invention, there is provided a superconducting device, in which a first superconductor of the p-conductive type and a second superconductor of the n-conductive type are kept in direct contact with each other, and a control electrode is provided in the vicinity of the contact portion between the first and second superconductors. An oxide superconductor is used as at least one of the first and second superconductors. The bending of the forbidden band of each superconductor can be varied by a voltage applied to the control electrode. That is, the effective width of a tunnel barrier can be varied by the above voltage. Thus, it is possible to realize a superconducting device of the transistor type which device can control a superconducting tunnel current due to the tunnel effect. The control electrode is provided on an insulating film formed on the first and second superconductors so that the control electrode is extended on both sides of the contact portion between the superconductors.

According to a further aspect of the present invention, there is provided a superconducting structure, in which a first superconducting layer of the p-conductive type and a second superconducting layer of the n-conductive type are kept in direct contact with each other or an insulating layer is sandwiched between the first and second superconducting layers so that a current can flow in directions substantially parallel to the interface between the first and second superconducting layers. When control electrodes are provided at both ends of the structure and the above current flowing in the structure is controlled by a voltage applied between the control electrodes, a superconducting device of the transistor type can be obtained.

According to still another aspect of the present invention, there is provided a superconducting circuit device which includes a superconducting thin film made of a p-superconductor (namely, a superconductor of the p-conductive type), a superconducting thin film made of an n-superconductor (namely, a superconductor of the n-conductive type), and an electromagnetic wave resonator so that an electromagnetic wave with a wavelength corresponding to the difference in energy gap between the p-superconductor and the n-superconductor can be emitted. In the above superconducting circuit device, the electromagnetic wave resonator is also used as an electromagnetic wave emitting path. Further, an electromagnetic waveguide is connected directly to the resonator. Alternatively, the electromagnetic waveguide may be connected to the resonator through an independent electromagnetic wave emitting path. It is preferable to use an oxide superconductor as the above-mentioned p- and n-superconductors.

According to still a further aspect of the present invention, there are provided oxide superconductors which are classified into three groups.

The first group has a composition expressed by a chemical formula $A_{2-x}N_xCuO_y$, where A indicates at least one element selected from a group consisting of Sr and Ca, N indicates an element which is nearly equal in ionic radius to Sr and Ca, can keep a desired crystal structure, and is able to have a valency greater than $+2$, that is, indicates at least one element selected from a group consisting of La, Ce, Pr, Nd, Sm, Gd, Tb, Tl, Pb, Bi, In and Y, x lies in a range from 0.05 to 0.4, preferably, from 0.15 to 0.2, and y indicates an oxygen content which is dependent on the amount x of the element N and the valency of copper, and satisfies a relation $2.6 \leq y \leq 3.0$ to maintain the crystal structure at a stable state.

The second group has a composition expressed by a chemical formula $A_{1-x}N'CuO_{y'}$, where A indicates at least one element selected from a group consisting of Sr and Ca, N' indicates at least one element selected from a group consisting of La, Ce, Pr, Nd, Sm, Gd, Tb, Tl, Pb, Bi, In and Y, x lies in a range from 0.05 to 0.4, preferably, from 0.15 to 0.2, and y' indicates an oxygen content which is dependent on the amount of the element N' and the valency of copper, and satisfies a relation $1.7 \leq y' \leq 2.0$ to keep a crystal structure at a stable state.

The third group has a composition expressed by a chemical formula $Ln_{2-x}M_xCuO_y$, where Ln indicates at least one element selected from a group consisting of Pr, Nd, Pm, Sm, Eu, Gd and Er, M indicates at least one element selected from a group consisting of Th, Tl, Pb and Bi, x lies in a range from 0.05 to 0.4, preferably, from 0.15 to 0.2, and y satisfies a relation $3.5 \leq y \leq 4$.

In the first embodiment of the present invention, a semiconductor layer or the combination of a semiconductor layer and an insulating layer is interposed between two superconducting thin films so that a current can flow between the superconducting thin films. In a case where only a semiconductor layer is sandwiched between the superconducting thin films, the thickness of the semiconductor layer is not limited. Meanwhile, in a case where a semiconductor layer and an insulating layer are sandwiched between the superconducting thin films, the thickness of the insulating layer is selected so that a tunnel current can flow across the insulating layer. Further, in a case where two or more semiconductor layers are interposed between the superconducting thin films, it is desirable to put a p-semiconductor layer in direct contact with a p-superconducting film and to put an n-semiconductor layer in direct contact with an n-superconducting film. This is because a pn junction has to be formed in a region, into which superconductivity can diffuse.

Further, a semiconductor layer interposed between the superconducting thim films is not required to have a very high impurity concentration. That is, the impurity concentration of the semiconductor layer can be made low. Thus, the resistivity of the semiconductor layer can be varied in a wide range. In this case, carriers flow across the insulating layer or the depletion layer of the semiconductor layer by the tunnel effect, or go over a barrier. The carriers may be positive holes or electrons, and are not always required to be superconducting Cooper pairs. Further, it is desirable that a superconducting thin film and a semiconductor layer adjacent thereto contain same elements, since the superconducting thin film and the semiconductor layer are successively deposited. For the same reason as mentioned above, it is desirable to put a p-semiconductor layer in contact with a p-superconducting thin film and to put an n-semiconductor layer in contact with an n-superconducting thin film.

Further, in a case where a third layer which is an insulating layer or the depletion layer of a semiconductor layer, is interposed between the superconducting thin films, the third layer can be kept at an electric field applied state. When light impinges on the third layer kept at the above state, carriers due to the light are accelerated by an electric field, and are then detected. Thus, a superconducting device for light detection can be obtained which is far superior in response characteristics to a conventional photodetector, in which photo-carriers are merely diffused and then detected. An optical fiber is used as means for irradiating the third layer with light. Alternatively, an optical system or an optical waveguide made of a solid material may be used in place of the optical fiber.

Further, in a case where means for applying a magnetic field to the third layer is provided, the superconductive coupling between first and second layers (that is, superconducting thin films) can be changed by the applied magnetic field. That is, the intensity of the applied magnetic field can be detected from a change in superconductive coupling. A strip line and a solenoid each made of a conductor, can be used as means for applying a magnetic field to the third layer.

When the first and second layers (that is, superconducting thin films) are made of an oxide superconductor, the superconducting device for light detection or magnetic-field detection can operate at a relatively high temperature, since the oxide superconductor has a high superconducting transition temperature.

Further, in a superconducting structure including the first layer made of a p-superconductor, the second layer made of an n-superconductor, and the third layer, electrons can be injected into the first layer, and positive holes can be injected into the second layer. By using the above structure, a superconducting device is obtained which can perform a high-speed operation on the basis of the injection of quasi particles.

In another embodiment of the present invention, a first electrode layer formed of a first superconductor is put in contact with a second electrode layer formed of a second superconductor. In this case, a tunnel barrier is formed at the contact portion between the first and second electrode layers, on the basis of the bending of forbidden band due to the difference in Fermi level between the first and second superconductors, and carriers move between the first and second superconductors on the basis of interband tunneling. In a case where the first superconductor is of the p-conductive type and the second superconductor is of the n-conductive type, the movement of carriers due to the interband tunneling occurs not only for superconducting Cooper pairs but also for positive holes or electrons. A current in this case is the superconducting current due to the Josephson effect.

Further, when a voltage is applied to a control electrode provided over the contact portion between first and second superconductors the electron or hole density in each superconductor is increased by the electric field effect, and superconductivity due to electron-hole interaction is improved by an increase in electron-hole pair density.

In other words, a superconducting device of the transistor type can be obtained, in which a superconducting tunnel current due to the tunnel effect is utilized, and the value of the superconducting tunnel current can be controlled by an applied control voltage. Thus, a superconducting integrated circuit can be formed by using the superconducting device.

The superconducting device operates on the basis of the tunnel effect, and thus can perform a high-speed operation. Further, the superconducting device is low in power dissipation, since the superconducting phenomenon is utilized.

Now, explanation will be made of a further embodiment of the present invention. When a first layer made of a first superconductor is kept in direct contact with a second layer made of a second superconductor, a tunnel barrier is formed on the basis of the bending of forbidden band due to the difference in Fermi level between the first and second superconductors, and carriers can move from one of the first and second superconductors to the other superconductor by the tunnel effect. Such a state is not limited to a case where a p-superconductor is kept in direct contact with an n-superconductor, but can be realized in a case where an insulating layer is sandwiched between the first layer made of the first superconductor and the second layer made of the second superconductor.

In the above cases, an electron pair and a hole pair are generated on one and the other sides of the tunnel barrier (due to the bending of forbidden band) or the insulating layer, respectively. In order to generate an electron pair which is a Bose particle, a positive charge for attracting electrons is required. In a case where a pair of electron and positive hole is present, the electron and the positive hole attract each other, and the electron-hole pair thus obtained becomes a Bose particle.

As pointed out by Yu E. Lozovik in 1975, when excitons are present at a high distribution density at low temperatures, Bose condensation is generated (refer to the JETP. Lett, Vol. 22, 1975, page 274). Accordingly, an electron and a positive hole have hitherto been isolated from each other by an insulating layer having a thickness of the order of the radius of exciton, and it is required that the energy of an electron system is stabilized by the generation of excitons in such an extent as a superconducting state is produced.

In the present embodiment, the first layer made of the first superconductor and the second layer made of the second superconductor can be put in a superconducting state by themselves. Accordingly, when excitons are generated at a high distribution density at low temperatures, the initial Bose condensation is strengthened. Thus, the superconducting transition temperature of a superconducting structure including the first and second layers is higher than the superconducting transition temperature in a case where only the first or second superconductor is used. This phenomenon is discovered by the present inventors, and a superconducting device based upon the discovery is considered to be a novel device.

When a voltage is applied to a control electrode formed over a contact portion between the first and second layers, the bending of forbidder band is changed. That is, the effective width of the tunnel barrier due to the bending of forbidden band can be controlled. Accordingly, the interaction of an electron and a positive hole through a forbidden band can be greatly changed by the above voltage.

Even in a case where the insulating layer is sandwiched between the first layer made of the first superconductor and the second layer made of the second superconductor, when the first layer is made of a p-superconductor and the second layer is made of an n-superconductor, the electron density in the first layer and the hole density in the second layer can be varied by the electric field effect, and thus the superconducting transition temperature of such a superconducting structure is varied. Accordingly, even in the above case, a superconducting device of the transistor type can be realized, in which the value of a superconducting current flowing in directions substantially parallel to the interface between the first and second layers can be controlled.

Figure 21:
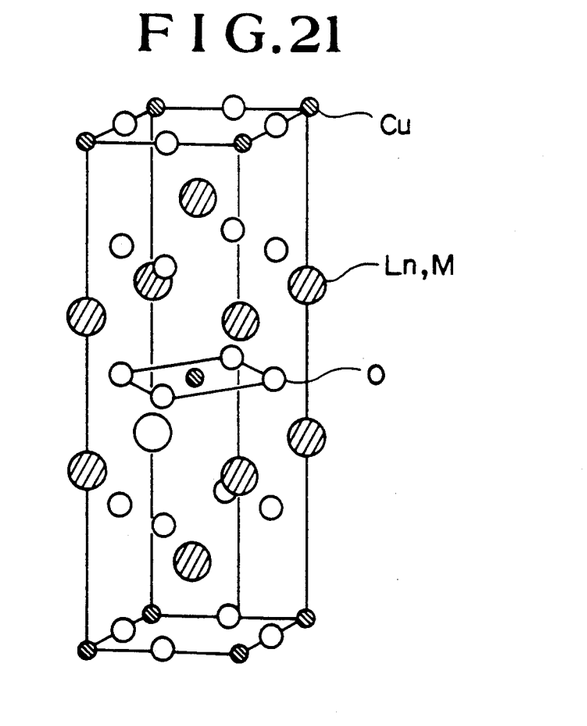
FIG. 21 is a schematic diagram showing the fundamental crystal structure of an oxide superconductor according to the present invention.

In still another embodiment of the present invention, an oxide superconductor is produced which has a crystal structure of the $Nd_2CuO_4$ type. FIG. 21 shows the crystal structure of the oxide superconductor. Referring to FIG. 21, lattice points where elements Ln and M are arranged, are called "A-site", and lattice points where copper atoms are arranged, are called "B-site". It is to be noted that a copper atom is placed in an area defined by square planar arrangement of oxygen atoms. A portion of the A-site is replaced by an element capable of having a valency more than four (4), to make the valency of copper less than two (2), thereby generating superconductivity.

The oxide superconductor can be produced in the following manner. Raw materials used include the oxide or nitrate of copper, the oxide or nitrate of each of the elements Ln and M, and the carbonate, oxide, peroxide, or hydroxide of the element A which will be explained later.

At first, the powdered raw materials are mixed in accordance with a cation ratio given by the chemical formula of the oxide superconductor. Then, preliminary burning is carried out in air for a period of 6 to 12 hours so that the raw materials react with each other. The compound obtained by the preliminary burning is pulverized and mixed by stirring. The powder thus obtained is pressed to a pellet. The pellet is baked in a reductive atmosphere at a temperature close to a temperature necessary for making the compound. Needless to say, the baking temperature is selected so that the compound is not decomposed. Inert gases such as Ar and $N_2$ can be used as the reductive atmosphere. A reductive atmosphere containing about 2% Ar or $N_2$ can also be used in the baking process.

DESCRIPTION OF THE PREFERRED EMBODIMENTS

The present invention will be explained below in detail, on the basis of embodiments thereof.

EMBODIMENT 1

Figure 1:
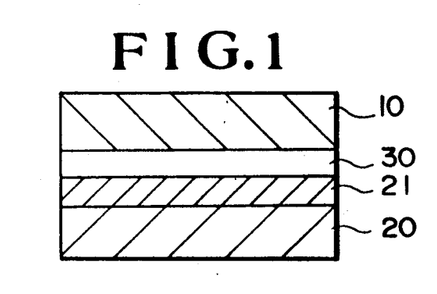
FIG. 1 is a sectional view showing a portion of a superconducting structure according to the first embodiment of the present invention.

FIG. 1 shows a superconducting structure according to the first embodiment of the present invention, in which structure a superconductor of the p-conductive type and a superconductor of the n-conductive type are arranged with an intervening member between the superconductors.

Referring to FIG. 1, a semiconductor layer 21 is formed on a superconductor layer 20 of the p-conductive type in such a manner that the semiconductor layer 21 contains substantially the same constituent elements as in the superconductor layer 20. The superconductor layer 20 is made of, for example, an oxide superconductor expressed by a chemical formula $YBa_2Cu_3O_{6.8}$. In this case, the semiconductor layer 21 is made of an oxide semiconductor expressed by a chemical formula $YBa_2Cu_3O_6$. The superconductor layer 20 has a thickness of about 300 nm, and the semiconductor layer 21 has a thickness of 5 nm. The thickness of each of the layers 20 and 21 is not limited to the above value, but can be freely selected, provided that the object of the present invention is attained. Next, an insulating film 30 which is made of MgO and has a thickness of 4 nm, is formed on the semiconductor layer 21. The thickness of the insulating film 30 is not limited to the above value, but can be freely selected, provided that carriers can pass through the insulating film 30 by the tunnel effect. Further, a superconductor layer 10 of the n-conductive type is formed on the insulating film 30. The superconductor layer 10 may be made of a metal superconductor, for example, an Nb-alloy or Pb-alloy, but it is preferable to make the superconductor layer 10 of an oxide superconductor of, for example, the Nb-Se-Cu-O system, or a ceramics superconductor. In the above structure, the superconductors 20 and 10 are spaced apart from each other, and thus the diffusion of a constituent element from one of the superconductors 10 and 20 into the other superconductor does not occur. Hence, the characteristics of the superconducting structure are stable, and the structure can be put in a superconducting state at high temperatures.

EMBODIMENT 2

Figure 2:
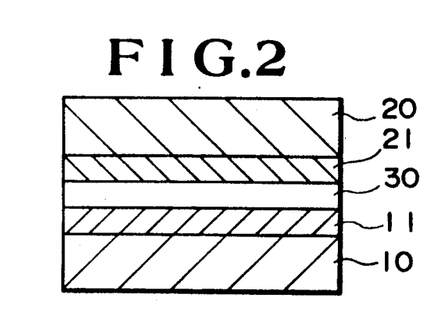
FIG. 2 is a sectional view showing a portion of a superconducting structure according to the second embodiment of the present invention.

FIG. 2 shows a superconducting structure according to the second embodiment of the present invention, in which structure a superconductor of the p-conductive type is spaced apart from a superconductor of the n-conductive type, and a p-semiconductor and an n-semiconductor are kept in direct contact with the p-superconductor and the n-superconductor, respectively.

The superconducting structure of FIG. 2 is different from the superconducting structure of FIG. 1 only in that an n-semiconductor layer 11 is sandwiched between the n-superconductor layer 10 and the insulating film 30. According to the present structure, the diffusion of a constituent element into each of the superconductor layers 10 and 20 due to heat treatment and aging is completely prevented. Thus, characteristics of the superconducting structure are very stable.

EMBODIMENT 3

Figure 3:
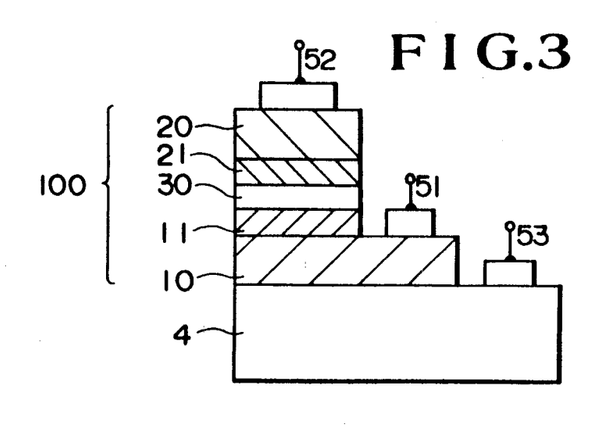
FIG. 3 is a sectional view showing a portion of a superconducting device according to the third embodiment of the present invention.

FIG. 3 shows a superconducting device according to the third embodiment of the present invention. In this superconducting device, as shown in FIG. 3, an n-semiconductor layer 4 is kept in direct contact with the n-superconductor layer 10 of a superconducting structure 100 which has the same structure as shown in FIG. 2, to form a super-Schottky diode of the layers 4 and 10. In the device having the above structure, a positive hole which is a quasi particle, is injected from the p-superconductor layer 20 into the n-superconductor layer 10. At this time, the superconductivity in the n-superconductor layer 10 is changed. For example, the balance between the electron-like excitation and the positive hole-like excitation is changed. The change in excitation balance is detected as a change in characteristics of the super-Schottky diode. Thus, the superconducting device can operate at a very high speed. Further, since the superconducting structure 100 is excellent in stability, the superconducting device can perform a stable operation at high temperatures. Although in the device of FIG. 3, the semiconductor layer 4 is put in contact with the n-superconductor layer 10, the semiconductor layer 4 may be put in contact with the p-superconductor layer 20. The semiconductor layer 4 has a thickness of about 200 nm, and is made of silicon which is doped with boron at a concentration of $1 \times 10^{19}$ cm$^{-3}$. Alternatively, the semiconductor layer 4 may be made of silicon doped with phosphorus. That is, p-silicon and n-silicon can be used to make the semiconductor layer 4. Further, the material of the layer 4 is not limited to silicon, but GaAs, germanium, GeP, InP, InAs, InSb and others can be used to make the semiconductor layer 4. Incidentally, reference numerals 51, 52 and 53 in FIG. 3 designate electrodes, which can be made of, for example, Au, Ag, or the like.

EMBODIMENT 4

Figure 4:
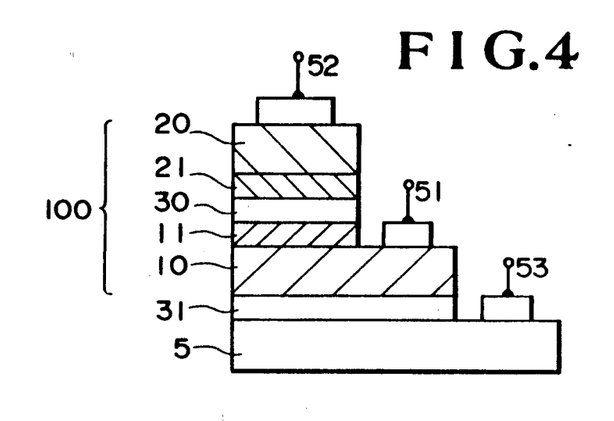
FIG. 4 is a sectional view showing a portion of a superconducting device according to the fourth embodiment of the present invention.

FIG. 4 shows a superconducting device according to the fourth embodiment of the present invention. The superconducting device of FIG. 4 is different from the device of FIG. 3 in that the combination of an insulating layer 31 and an electrode layer 5 are used in place of the semiconductor layer 4, and an injected quasi particle is detected by a tunnel structure formed between the n-superconductor layer 10 and the electrode layer 5. The insulating layer 31 is made of at least one material selected from a group consisting of $Al_2O_3$, $SiO_2$ and MgO, or is a self-oxide film formed on the electrode layer 5. The thickness of the insulating layer 31 is selected so that carriers can pass through the insulating layer 31 by the tunnel effect. For example, the insulating layer 31 has a thickness of 2 nm.

In the superconducting devices of FIGS. 3 and 4, carriers are injected from the p- or n-superconductor layer into a desired layer, and the characteristics of the superconducting structure used are stable. Accordingly, the superconducting devices can operate at an ultra-high speed, and the characteristics of each superconducting device are scarcely affected by manufacturing processes and aging. Further, a quasi particle current from the superconducting structure varies non-linearly with an applied voltage, and moreover shows a negative-resistance characteristic. Accordingly, the superconducting devices can perform a novel function such as the multi-value logic. This is an advantage of the above superconducting devices.

EMBODIMENT 5

Figure 5:
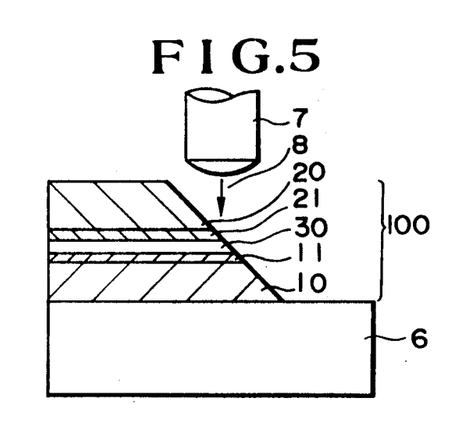
FIG. 5 is a sectional view showing a portion of a superconducting device according to the fifth embodiment of the present invention.

FIG. 5 shows a superconducting device according to the fifth embodiment of the present invention. Referring to FIG. 5, an optical fiber 7 is so disposed as to irradiate that portion of the superconducting structure where an electric field is generated, with light 8 from the optical fiber 7. That is, the insulating film 30 or the semiconductor layers 11 and 21 are irradiated with the light 8. The light 8 has a wavelength of 0.63 μm, and the side face of the device is exposed to the outside air to improve the irradiation efficiency of the light 8. In this case, carriers generated by the light 8 are accelerated by the above electric field, and then detected. Thus, a high-speed photodetector is formed of the above superconducting device.

EMBODIMENT 6

Figure 6:
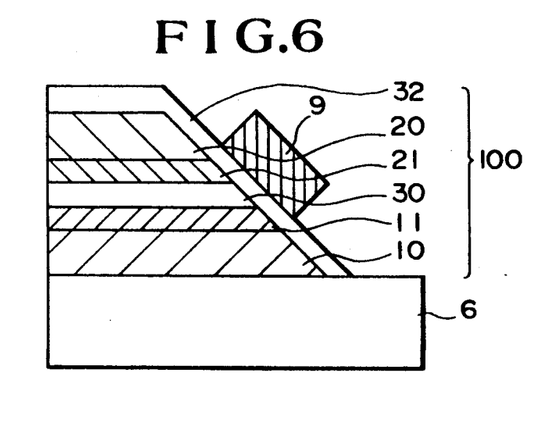
FIG. 6 is a sectional view showing a portion of a superconducting device according to the sixth embodiment of the present invention.

FIG. 6 shows a superconducting device according to the sixth embodiment of the present invention. Referring to FIG. 6, a control wire 9 for generating a magnetic field is provided on an insulating film 32 which is formed on the superconducting structure 100. When a current flows through the control wire 9, a magnetic field is generated around the wire 9, and can be detected by the device.

EMBODIMENT 7

Figure 7:
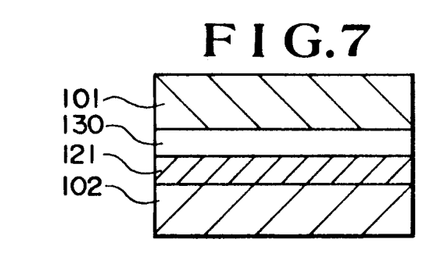
FIG 7 is a sectional view showing a portion of a superconducting structure according to the seventh embodiment of the present invention.

FIG. 7 shows a superconducting structure according to the seventh embodiment of the present invention. This superconducting structure includes a superconductor layer of the first conductive type, a semiconductor layer of the second conductive type, and a third layer. In a case where the third layer is made of a semiconductor of the first conductive type, the thickness of the third layer is selected so that the superconductivity diffused from the superconductor layer is spread all over the third layer. In more detail, the thickness of the third layer is made less than a value which is ten times as large as the coherent length in the third layer. Preferably, the thickness of the third layer is made less than a value which is five times as large as the above coherent length. Referring now to FIG. 7, a semiconductor layer 121 is formed directly on a superconductor layer 102 of the p-conductive type in such a manner that the semiconductor layer 121 contains substantially the same constituent elements as in the superconductor layer 102. For example, the superconductor layer 102 is made of an oxide superconductor expressed by a chemical formula $YBa_2Cu_3O_{6.8}$. In this case, the semiconductor layer 121 is made of an oxide semiconductor expressed by a chemical formula $YB_2Cu_3O_6$. The superconductor layer 102 has a thickness of about 300 nm, and the semiconductor layer 121 has a thickness of 5 nm. However, the thickness of each of the layers 102 and 121 is not limited to the above value, but can be freely selected, provided that the object of the present invention can be attained.

Next, an insulating film 130 which is made of MgO and has a thickness of 4 nm, is formed on the semiconductor layer 121. However, the thickness of the insulating film 130 is not limited to this value, but can be freely selected, provided that carriers can pass through the insulating layer 130 by the tunnel effect. Further, a semiconductor layer 101 of the n-conductive type is formed on the insulating layer 130. The semiconductor layer 101 is made of silicon doped with phosphorus. In this superconducting structure, the diffusion of a constituent element from one of the superconductor layer 102 and the semiconductor layer 101 into the other layer does not occur. Accordingly, the characteristics of the superconducting structure are stable.

EMBODIMENT 8

Figure 8:
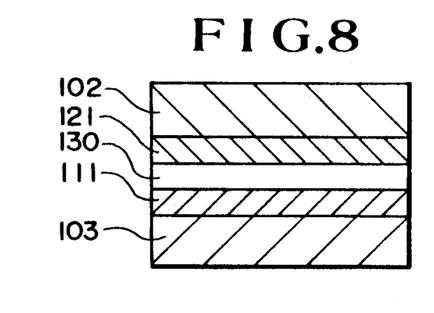
FIG. 8 is a sectional view showing a portion of a superconducting structure according to the eighth embodiment of the present invention.

FIG. 8 shows a superconducting structure according to the eighth embodiment of the present invention. In this superconducting structure, the semiconductor layer of the second conductive type is replaced by a metal layer. In more detail, as shown in FIG. 8, a metal layer of the n-conductive type 103 is piled on the insulating layer 130 through an n-semiconductor layer 111. An evaporation film which is made of silver and has a thickness of about 200 nm, can be used as the metal layer 103.

In the superconducting structures of FIGS. 7 and 8, both of the semiconductor layer 121 and the insulating layer 130 are interposed between the superconductor layer 102 and the semiconductor layer 101 (or the metal layer 103). However, either one of the semiconductor layer 121 and the insulating layer 130 may be omitted.

EMBODIMENT 9

Figure 9:
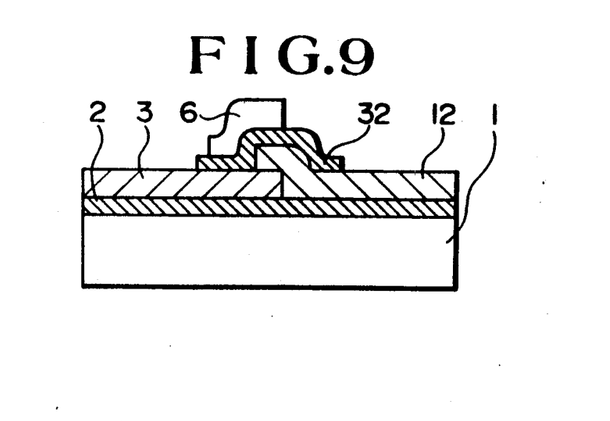
FIG. 9 is a sectional view showing a portion of a superconducting device according to the ninth embodiment of the present invention.

FIG. 9 shows a superconducting device according to the ninth embodiment of the present invention, in which device the contact portion between an electrode layer made of a first superconductor and another electrode layer made of a second superconductor is covered with an insulating film, and a control electrode is formed on the insulating film. Referring to FIG. 9, a silicon dioxide film 2 of about 200 nm thick is formed, by the thermal oxidation method, on a substrate 1 made of a silicon single crystal. Next, an electrode layer 3 which has a thickness of 500 nm and is made of a first superconductor (for example, oxide ceramics superconductor expressed by a chemical formula $YBa_2Cu_3O_7$), is formed on the silicon dioxide film 2 in an atmosphere of oxygen by the reactive sputtering method. Then, another electrode layer 12 which has a thickness of 500 nm and is made of a second superconductor (for example, oxide ceramics superconductor expressed by a chemical formula $Nd_{1.7}Ce_{0.3}CuO_4$), is formed on the silicon dioxide film 2 in the atmosphere of oxygen by the reactive sputtering method so that the electrode layers 3 and 12 overlap each other.

When each of the electrode layer 3 and 12 is formed, the above superconductive material is evaporated through a metal mask so that each electrode layer has a desired pattern. However, the patterning of the electrode layers is not limited to the evaporation method using a metal mask, but each of the electrode layers 3 and 12 can be patterned by the combination of the photolithography and the chemical etching method (or dry etching method).

Next, an insulating film 32 which has a thickness of about 20 nm and is made of silicon dioxide, is formed by the chemical vapor deposition method so that at least the contact portion between the electrode layers 3 and 12 is covered with the insulating film 32. Next, an aluminum film of about 1 μm thick is formed on the insulating film 32 by the resistive heat evaporation in vacuum so that the aluminum film is extended at least over the contact portion between the electrode layers 3 and 12. Then, chemical etching is carried out for the aluminum film while using a photoresist pattern as a mask, to form a control electrode 6 having a width of 30 μm. The superconducting device thus obtained was cooled and then operated in liquid helium. At this time, a superconducting tunnel current flowing between the electrode layers 3 and 12 was changed by varying the voltage applied to the control electrode 6. That is, the superconducting device was able to perform a transistor action.

EMBODIMENT 10

Figure 10:
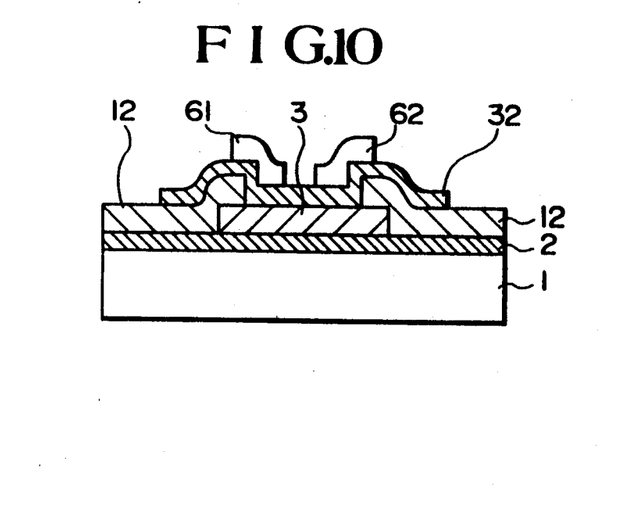
FIG. 10 is a sectional view showing a portion of a superconducting device according to the tenth embodiment of the present invention.

FIG. 10 shows a superconducting device according to the tenth embodiment of the present invention, in which device the control electrode of FIG. 9 is provided at two positions. The superconducting device is equal in fabrication process and materials used, to the superconducting device of FIG. 9. However, the device of FIG. 10 is different from the device of FIG. 9 in the following points. The electrode layer 3 which has a thickness of 500 nm and is made of the oxide ceramics superconductor expressed by the chemical formula $YBa_2Cu_3O_7$, is first formed in the atmosphere of oxygen by the reactive sputtering method, and is then patterned so as to have a predetermined shape. Next, the electrode layer 12 which has a thickness of 500 nm and is made of the oxide ceramics superconductor expressed by the chemical formula $Nd_{1.7}Ce_{0.3}CuO_4$, is formed in the atmosphere of oxygen by the reactive sputtering method, and is then separated into two parts so that facing ends of the two parts are placed on the electrode layer 3. In this case, two contact portions are formed between the electrode layer 3 and the electrode layer 12, and a tunnel barrier is formed at each of the contact portions. Accordingly, the superconducting device has a structure that two superconducting elements are connected in series. Control electrodes 61 and 62 made of aluminum are provided on the insulating film 32 so that each of the control electrodes 61 and 62 is extended at least over a corresponding one of the contact portions and the control electrodes 61 and 62 are electrically independent of each other. However, the control electrodes 61 and 62 may be electrically connected with each other, to be used as a single control electrode. The superconducting device was cooled and then operated in liquid helium. At this time, a superconducting tunnel current flowing between the electrode layers 3 and 12 was changed by varying voltages applied to the control electrodes 61 and 62. That is, the superconducting device was able to perform a transistor action.

EMBODIMENT 11

Figure 11:
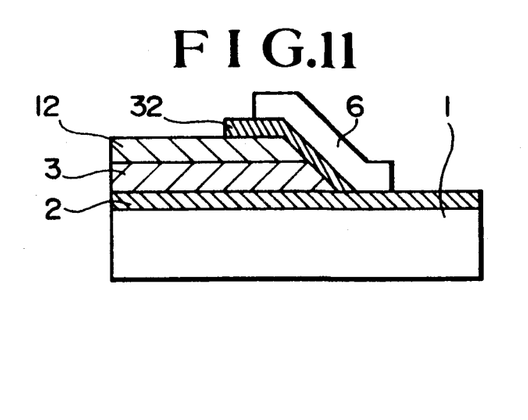
FIG. 11 is a sectional view showing a portion of a superconducting device according to the eleventh embodiment of the present invention.

FIG. 11 shows a superconducting device according to the eleventh embodiment of the present invention, in which device an end of the contact portion between an electrode layer made of a first superconductor and another electrode layer made of a second superconductor is exposed, to be covered with an insulating film, and a control electrode is provided on the insulating film.

Referring to FIG. 11, a silicon dioxide film 2 of about 200 nm thick is formed, by the thermal oxidation method, on a substrate 1 made of a silicon single crystal Next, an electrode layer 3 which has a thickness of 500 nm and is made of a first superconductor (for example, oxide ceramics superconductor expressed by a chemical formula $YBa_2Cu_3O_7$), is formed on the silicon dioxide film in an atmosphere of oxygen by the reactive sputtering method. Then, another electrode layer 12 which has a thickness of 500 nm and is made of a second superconductor (for example, oxide ceramics superconductor expressed by a chemical formula $Nd_{1.7}Ce_{0.3}CuO_4$), is formed on the electrode layer 3 in the atmosphere of oxygen by the reactive sputtering method.

The laminate of the electrode layers 3 and 12 is processed so as to have the side face shown in FIG. 11. This processing can be carried out by a chemical etching method or dry etching method.

Next, an insulating film 32 which has a thickness of about 20 nm and is made of silicon dioxide, is formed on the side face of the laminate so that at least an exposed end of the contact portion between the electrode layers 3 and 12 is covered with the insulating film 32. Next, an aluminum film is formed on the insulating film 32 by the resistive heat evaporation in the vacuum so that the aluminum film is extended at least over the above end of the contact portion between the electrode layers 3 and 12. Then, chemical etching is carried out for the aluminum film while using a photoresist pattern as a mask, to form a control electrode having a width of 3 $\mu$m. The superconducting device thus obtained was cooled and then operated in liquid helium. At this time, a superconducting tunnel current flowing between the electrode layers 3 and 12 was changed by varying the voltage applied to the control electrode 6. That is, the superconducting device was able to perform a transistor action.

EMBODIMENT 12

Figure 12:
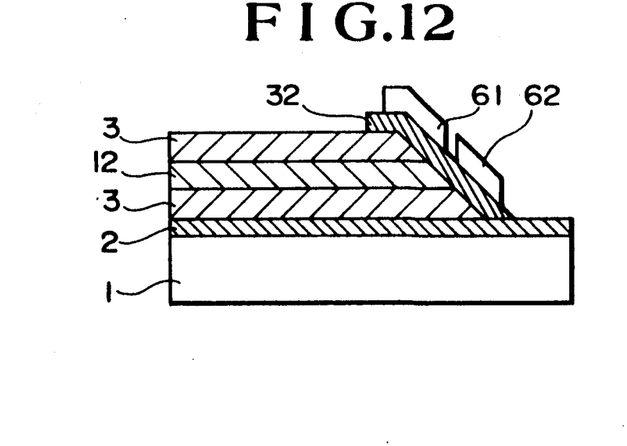
FIG. 12 is a sectional view showing a portion of a superconducting device according to the twelfth embodiment of the present invention.

FIG. 12 shows a superconducting device according to the twelfth embodiment of the present invention, in which device the control electrode of FIG. 11 is provided at two positions. The superconducting device of FIG. 12 is equal in fabricating process and materials used, to the superconducting device of FIG. 11, but is different from the latter device in the following points. Referring to FIG. 12, a first electrode layer 3 which has a thickness of 500 nm and is made of a first superconductor (for example, oxide ceramics superconductor expressed by a chemical formula $YBa_2Cu_3O_7$) is repeatedly formed in an atmosphere of oxygen by the reactive sputtering method so that a second electrode layer 12 which has a thickness of 500 nm, is made of a second superconductor (for example, oxide ceramics superconductor expressed by a chemical formula $Nd_{1.7}Ce_{0.3}CuO_4$), and is formed in the atmosphere of oxygen by the reactive sputtering method, is sandwiched between the first electrode layers 3. In this case, a tunnel barrier is formed at the contact portion between the second electrode layer and one of the first electrode layers 3, and another tunnel barrier is formed at the contact portion between the second electrode layer and the other first electrode layer. Thus, the superconducting device has a structure that two superconducting elements are connected in series. Further, the laminate of the first electrode layers 3 and the second electrode layer 12 is processed so as to have the side face shown in FIG. 12, and an insulating film 32 is formed on the side face of the laminate. Then, control electrodes 61 and 62 are formed on the insulating film 32 so that the control electrode 61 is extended at least over an end of the contact portion between the upper first electrode layer 3 and the second electrode layer 12, the control electrode 62 is extended at least over an end of the contact portion between the lower first electrode layer 3 and the second electrode layer 12, and the control electrodes 61 and 62 are electrically isolated from each other. The control electrodes 61 and 62 may be electrically connected with each other, to be used as a single control electrode. The superconducting device thus obtained was cooled and then operated in liquid helium. At this time, a superconducting tunnel current flowing through three electrode layers was changed by varying voltages applied to the control electrodes 61 and 62. That is, the superconducting device was able to perform a transistor action.

In the above-mentioned superconducting structures or devices, an oxide superconductor containing yttrium is used as the first superconductor of the p-conductive type. Alternatively, an oxide superconductor containing lanthanum, bismuth, or thallium may be used as the first superconductor.

Further, in the superconducting device of FIG. 12, an oxide ceramics superconductor expressed by a chemical formula $Nd_{1.7}Ce_{0.3}CuO_4$ is used as the second superconductor of the n-conductive type. However, the second superconductor may be an oxide ceramics superconductor expressed by a chemical formula which is obtained by replacing the neodymium (Nd) of the chemical formula $Nd_{1.7}Ce_{0.3}CuO_4$ by at least one element selected from a group consisting of Pr, Pm, Sm, Eu, Gd and Er. Alternatively, the second superconductor may be an oxide ceramics superconductor expressed by a chemical formula which is obtained by replacing the cerium (Ce) of the chemical formula $Nd_{1.7}Ce_{0.3}CuO_4$ by at least one element selected from a group consisting of Th, Tl, Pb and Bi. Further, the second superconductor of the n-conductive type may be a superconducting metal (for example, Nb or Pb), a superconducting alloy containing Pb, or one of intermetallic compounds containing Nd such as NbN, $Nb_3Sn$, $Nb_3Ge$, $Nb_3Al$ and $Nb_3Si$.

EMBODIMENT 13

Figure 13:
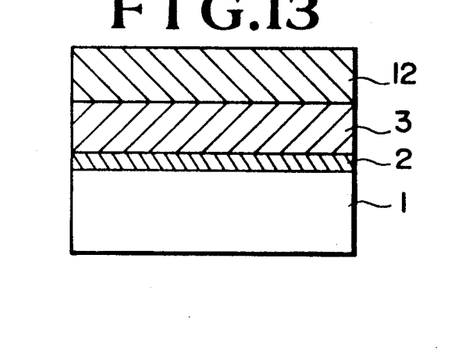
FIG. 13 is a sectional view showing a portion of a superconducting structure according to the thirteenth embodiment of the present invention.

FIG. 13 shows a superconducting structure according to the thirteenth embodiment of the present invention, in which structure an electrode layer made of the first superconductor and another electrode layer made of the second superconductor are piled on an insulating layer formed on a substrate, that is, two electrode layers are put in direct contact with each other.

Referring to FIG. 13, a silicon dioxide film 2 of about 200 nm thick is formed, by the thermal oxidation method, on a substrate 1 made of a silicon single crystal. Next, an electrode layer 3 which has a thickness of 500 nm and is made of the first superconductor (for example, oxide ceramics superconductor expressed by a chemical formula $YBa_2Cu_3O_{7-\delta}$), is formed is formed on the silicon dioxide film 2 in an atmosphere of oxygen by the reactive sputtering method. Then, another electrode layer 12 which has a thickness of 500 nm and is made of the second superconductor (for example, oxide ceramics superconductor expressed by a chemical formula $Nd_{1.7}Ce_{0.3}CuO_4$) formed on the electrode layer 3 in the atmosphere of oxygen by the reactive sputtering method, to complete the superconducting structure.

In the above superconducting structure, the thickness of each electrode layer is made equal to 500 nm. This thickness is larger than the superconducting coherent length in the first and second superconductors. However, in a case where a current is forced to flow in directions substantially parallel to the boundary between two electrode layers, the superconducting transition temperature at the boundary is high. Thus, the superconducting device can attain the object of the present invention.

In general, it is desirable that the thickness of each electrode layer made of the superconductor is about twenty times as large as the superconducting coherent length in the superconductor. Preferably, the thickness of the electrode layer is made equal to or less than a value which is ten times as large as the superconducting coherent length. In this case, the whole of the superconducting structure has a high superconducting transition temperature, and thus can operate at high temperatures.

EMBODIMENT 14

Figure 14:
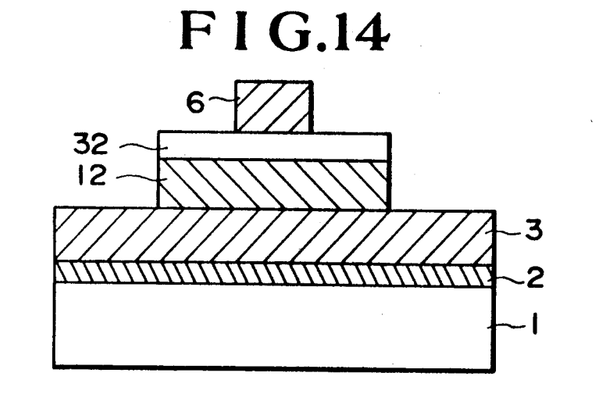
FIG. 14 is a sectional view showing a portion of a superconducting device according to the fourteenth embodiment of the present invention.

FIG. 14 shows a superconducting device according to the fourteenth embodiment of the present invention, in which device a control electrode is formed at the top of the superconducting structure of FIG. 13 through an insulator. The superconducting structure used in the superconducting device of FIG. 14 is substantially equal in fabrication process and materials used, to the superconducting structure of FIG. 13. In the device of FIG. 14, however, each of the electrode layers 3 and 12 is formed by the evaporation method using a metal mask so that the electrode layers 3 and 12 have desired patterns. Alternatively, the patterning of each electrode layer may be made by the combination of the photolithography and the chemical etching method (or dry etching method).

Further, an insulating film 32 which has a thickness of about 20 nm and is made of silicon dioxide, is formed on the electrode layer 12 by the chemical vapor deposition method so that the insulating film 32 is extended at least over the contact portion between the electrode layers 3 and 12. Next, an aluminum film of about 1 μm thick is formed on the insulating film 32 by the resistive heat evaporation in vacuum so that the aluminum film is extended over the contact portion between the electrode layers 3 and 12. Then, chemical etching is carried out for the aluminum film while using a photoresist pattern as a mask, to form a control electrode 6 having a width of 3 μm. The superconducting device thus obtained was cooled and then operated in liquid helium. At this time, a superconducting tunnel current flowing between the electerode layers 3 and 12 was changed by varying a voltage applied to the control electrode 6. That is, the superconducting device was able to perform a transistor action.

EMBODIMENT 15

Figure 15:
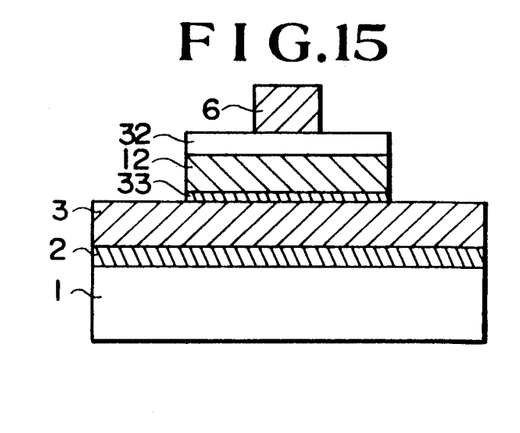
FIG. 15 is a sectional view showing a portion of a superconducting device according to the fifteenth embodiment of the present invention.

FIG. 15 shows a superconducting device according to the fifteenth embodiment of the present invention, in which device an insulating film for separation, for example, a magnesium oxide film is sandwiched between the electrode layers 3 and 12 of FIG. 14.

Referring to FIG. 15, a silicon dioxide film 2 of about 200 nm thick is formed, by the thermal oxidation method, on a substrate 1 made of a silicon single crystal. Next, an electrode layer 3 which has a thickness of 500 nm and is made of first superconductor (for example, oxide ceramics superconductor expressed by a chemical formula $YBa_2Cu_3O_{7-\delta}$), is formed on the silicon dioxide film 2 in an atmosphere of oxygen by the reactive sputtering method. Then, an insulating film 33 for separation (for example, a MgO film of about 10 nm thick) and another electrode layer 12 which has a thickness of 500 nm and is made of a second superconductor (for example, oxide ceramics superconductor expressed by a chemical formula $Nd_{1.7}Ce_{0.3}CuO_4$), are successively formed in the atmosphere of oxygen by the reactive sputtering method.

The electrode layers 3 and 12 are processed so as to have desired patterns. The patterning of each electrode layer can be made by the chemical or dry etching method.

Next, an insulating film 32 which has a thickness of about 20 nm and is made of silicon dioxide, is formed on the electrode layer 12 by the chemical vapor deposition method so that the insulating layer 32 is extended at least over an area where the electrode layers 3 and 12 face each other. Then, an aluminum film of about 1 μm thick is formed on the insulating film 32 by the resistive heat evaporation in vacuum so that the aluminum film is extended over the area where the electrode layers 3 and 12 face each other. Thereafter, chemical etching is carried out for the aluminum film while using a photoresist pattern as a mask, to form a control electrode 6 having a width of 3 μm. The superconducting device thus obtained was cooled and then operated in liquid helium At this time, a superconducting tunnel current flowing between the electrode layers 3 and 12 was changed by varying a voltage applied to the control electrode 6. That is, the superconducting device was able to perform a tansistor action

EMBODIMENT 16

Figure 16:
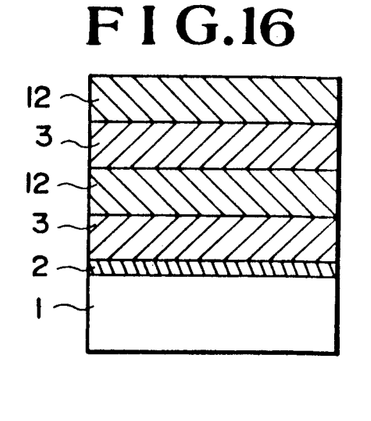
FIG. 16 is a sectional view showing a portion of a superconducting structure according to the sixteenth embodiment of the present invention.

FIG. 16 shows a superconducting structure according to the sixteenth embodiment of the present invention, in which structure a first electrode layer made of a first superconductor and a second electrode layer made of a second superconductor are alternately and repeatedly piled. The superconductng structure of FIG. 16 is equal in fabrication process and materials used, in the superconducting structure of FIG. 13, but is different from the latter structure in the following point.

Referring to FIG. 16, a first electrode layer having a thickness of 500 nm and made of a first superconductor (for example, oxide ceramics superconductor expressed by a chemical formula $Yba_2Cu_3O_{7-\delta}$) and a second electrode layer 13 having a thickness of 500 nm and made of a second superconductor (for example, oxide ceramics superconductor expressed by a chemical formula $Nd_{1.7}Ce_{0.3}CuO_4$) are both formed in an atmosphere of oxygen by the reactive sputtering method, and the first electrode layer 3 and the second electrode layer 12 are alternately and repeatedly piled on the silicon dioxide film 2 formed on the substrate 1. In this case, a superconducting transition temperature can be increased all over a desired area or volume.

In the superconducting structures or devices of FIGS. 13 to 16, an oxide superconductor containing yttrium (Y) is used as the first superconductor of the p-conductive type. Alternatively, an oxide superconductor containing lanthanum (La), bismuth (Bi) or thallium (Tl) may be used as the first superconductor.

EMBODIMENT 17

Figure 17:
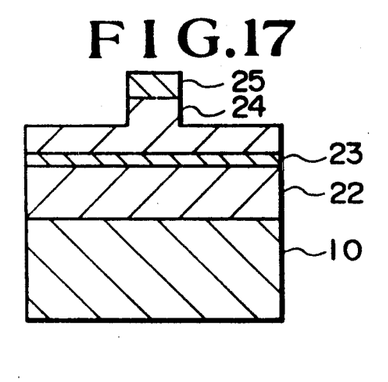
FIG. 17 is a sectional view showing a portion of a superconducting device according to the seventeenth embodiment of the present invention.

FIG. 17 shows a superconducting device according to the seventeenth embodiment of the present invention, in which device a plurality of superconductor layers having different energy gaps are piled.

Figure 18:
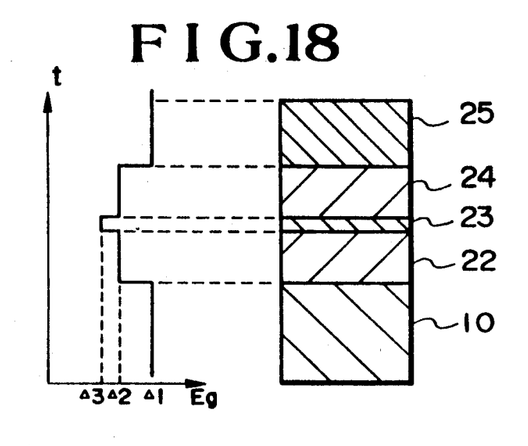
FIG. 18 is a diagram showing the energy-gap distribution in the superconducting device of FIG. 17.

Referring to FIG. 17, an n-superconductor layer 22 having an energy gap $\Delta_2$, a p-superconductor layer 23 having an energy gap $\Delta_3$, a p-superconductor layer 24 having the energy gap $\Delta_2$ and a p-superconductor layer 25 having an energy gap $\Delta_1$ are successively piled on a substrate 1 which is made of an n-superconductor having the energy gap $\Delta_1$. FIG. 18 shows the energy-gap distribution in the superconducting device.

As shown in FIG. 18, the energy gap is made smallest at the superconductor layer 23. When a current is injected into the pn junction, a quasi particle is excited only in the superconductor layer 23, and is excited to the energy level $\Delta_3$. Since the layer 23 is sandwiched between the superconductor layers 22 and 24 having the energy gap $\Delta_2$, the excited quasi particle is relaxed. At this time, an electromagnetic wave having a wavelength corresponding to the difference between the energy gap $\Delta_3$ and the energy gap $\Delta_2$ is emitted.

In the superconducting device, the total thickness of the superconductor layers 22, 23 and 24 is made equal to an integral multiple of the wavelength of the electromagnetic wave in a medium where the electromagnetic wave is generated. In this case, the superconductor layers 22, 23 and 24 can act as a resonator and an electromagnetic wave emitting path. Further, an electromagnetic waveguide such as a fiber waveguide can be connected to the superconductor layers 22, 23 and 24. When the length of the superconducting device is made equal to an integral multiple of the above wavelength of the electromagnetic wave, the electromagnetic wave is repeatedly reflected from the end faces of the device. Thus, the intensity of the electromagnetic wave is increased, and a coherent electromagntic wave can be emitted from one of the end faces to the electromagnetic waveguide.

Figure 19:
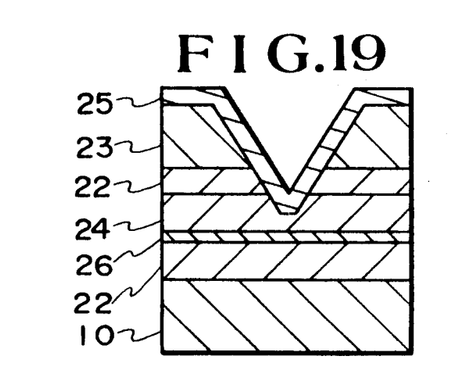
FIGS. 19 and 20 are sectional views showing modified versions of the superconducting device of FIG. 17.

FIG. 19 shows a modified version of the superconducting device of FIG. 18. Referring to FIG. 19, a laminate of superconducting layers 22, 26, 24, 22 and 23 is formed on a substrate 10 which is made of an n-superconductor having an energy gap $\Delta_1$, and a V-shaped groove is provided in the laminate. Then, a p-suerconductor layer 25 having an energy gap $\Delta_1$ is formed so that the side wall of the groove is covered with the layer 25. In this case, the generation of quasi particle due to the current injection is localized. Thus, the relaxation efficiency of quasi particle is improved, and the generation efficiency of electromagnetic wave is also improved. Further, the performance of the electromagnetic resonator or electromagnetic wave emitting path is improved.

Figure 20:
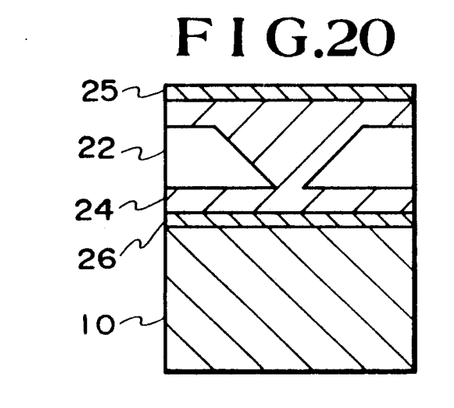

FIG. 20 shows another modified version of the superconducting device of FIG. 18. Referring to FIG. 20, a substrate 1 is made of an n-superconductor having an energy gap $\Delta_1$, and superconductor layers 26, 24 and 25 are piled on the substrate 1 in such a manner that a superconductor layer 22 having a pair of tapered edges which face each other, is buried in the layer 24. In this device, the generation of quasi particle due to the current injection is localized. Thus, the relaxation efficiency of quasi particle is improved, and the generation efficiency of electromagnetic wave is also improved. Further, the performance of the electromagnetic resonator or electromagnetic wave emitting path is improved.

Each of the superconducting devices of FIGS. 18 to 20 is small in size. Accordingly, a multiplicity of superconducting devices can be formed on a substrate. When such superconducting devices on the substrate are combined with electromagnetic waveguides, optical fibers and other kinds of superconducting devices, signal processing and data communication can be efficiently carried out.

EMBODIMENT 18

Figure 22:
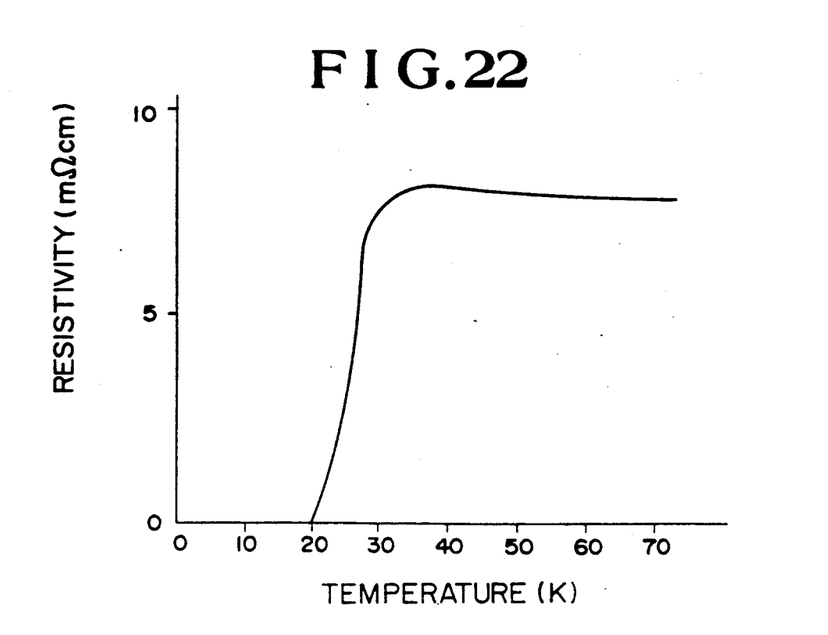
FIG. 22 is a graph showing the temperature-resistivity characteristic of the oxide superconductor of FIG. 21.

Now, explanation will be made of an oxide superconductor according to the eighteenth embodiment of the present invention, with reference to FIGS. 21 and 22. This oxide superconductor is produced in the following manner. At first, 15.9 g of cupric oxide (CuO) powder, 62.3 g of neodymium oxide ($Nd_2O_3$) powder and 6.7 g of lead monoxide (PbO) powder are mixed. This mixing ratio is determined in accordance with the cation ratio in a chemical formula $Nd_{1.85}Pb_{0.15}CuOy$. The mixture is heated in air at a temperature of 800° to 900° C. for 12 hours. The compound thus obtained is pulverized, mixed by stirring, and then pressed to a tablet. The tablet is baked in an atmosphere of argon (Ar) at 600° C. for 12 hours to reduce the compound, thereby obtaining an oxide superconductor of the Nd-u-O system. The oxide superconductor thus obtained has a composition expressed by a chemical formula $Nd_{1.85}Pb_{0.15}CuOy$.

Further, it is known from an X-ray diffraction pattern that the oxide superconductor has a crystal structure of the $Nd_2CuO_4$ type. The neodynium, lead and copper contained in the oxide superconductor can be quanititatively determined by the photo-emission spectrochemical analysis, and the mean valency of copper and the oxygen content can be determined by the coulombmetric titration. The oxide superconductor can show superconductivity at a temperature of 20° K. or more. FIGS. 21 and 22 show the crystal structure and temperature vs resistivity characteristic of the oxide superconductor, respectively.

Various oxide superconductors shown in the following table were produced, and it was confirmed that these oxide superconductors had substantially the same characteristics as in the above oxide superconductor.

|  | powder | | | synthesis temperature °C. | baking temperature °C. |
|---|---|---|---|---|---|
| $Nd_{1.85}Th_{0.15}CuOy$ | $Nd_2O_3$ | $ThO_2$ | $CuO$ | 1020 | 900 |
| $Nd_{1.85}Tl_{0.15}CuOy$ | $Nd_2O_3$ | $Tl_2O_3$ | $CuO$ | 920 | 850 |
| $Nd_{1.85}Pb_{0.15}CuOy$ | $Nd_2O_3$ | $PbO$ | $CuO$ | 900 | 850 |
| $Nd_{1.85}Bi_{0.15}CuOy$ | $Nd_2O_3$ | $Bi_2O_3$ | $CuO$ | 920 | 850 |
| $Gd_{1.85}Th_{0.15}CuOy$ | $Gd_2O_3$ | $ThO_2$ | $CuO$ | 1020 | 900 |
| $Gd_{1.85}Tl_{0.15}CuOy$ | $Gd_2O_3$ | $Tl_2O_3$ | $CuO$ | 920 | 850 |
| $Gd_{1.85}Pb_{0.15}CuOy$ | $Gd_2O_3$ | $PbO$ | $CuO$ | 900 | 850 |
| $Gd_{1.85}Bi_{0.15}CuOy$ | $Gd_2O_3$ | $Bi_2O_3$ | $CuO$ | 920 | 850 |

Further, the following materials similar to the above oxide superconductors can also be used as superconductors.

$Pr_{1.85}Th_{0.15}CuOy$, $Pr_{1.85}Tl_{0.15}CuOy$,
$Pr_{1.85}Pb_{0.15}CuOy$, $Pr_{1.85}Bi_{1.15}CuOy$,
$Pm_{1.85}Th_{0.15}CuOy$, $Pm_{1.85}Tl_{0.15}CuOy$,
$Pm_{1.85}Pb_{0.15}CuOy$, $Pm_{1.85}Bi_{0.15}CuOy$,
$Sm_{1.85}Th_{0.15}CuOy$, $Sm_{1.85}Tl_{1.15}CuOy$,
$Sm_{1.85}Pb_{0.15}CuOy$, $Sm_{1.85}Bi_{0.15}CuOy$,
$Eu_{1.85}Th_{0.15}CuOy$, $Eu_{1.85}Tl_{0.15}CuOy$,
$Eu_{1.85}Pb_{0.15}CuOy$, $Eu_{1.85}Bi_{0.15}CuOy$,
$Er_{1.85}Th_{0.15}CuOy$, $Er_{1.85}Tl_{0.15}CuOy$,
$Er_{1.85}Pb_{0.15}CuOy$, $Er_{1.85}Bi_{0.15}CuOy$,
$Nd_{1.85}Pb_{0.08}Bi_{0.07}CuOy$,
$Nd_{1.85}Tl_{0.08}Bi_{0.07}CuOy$,
$Nd_{1.85}Tl_{0.07}CuOy$,
$Gd_{1.85}Pb_{0.07}Bi_{0.08}CuOy$,
$Gd_{1.85}Tl_{0.07}Bi_{0.08}CuOy$,
$Gd_{1.85}Tl_{0.07}Pb_{0.08}CuOy$,
$Nd_{1.95}Pb_{0.05}CuOy$, $Nd_{1.6}Pb_{0.4}CuOy$

EMBODIMENT 19

Figure 23:
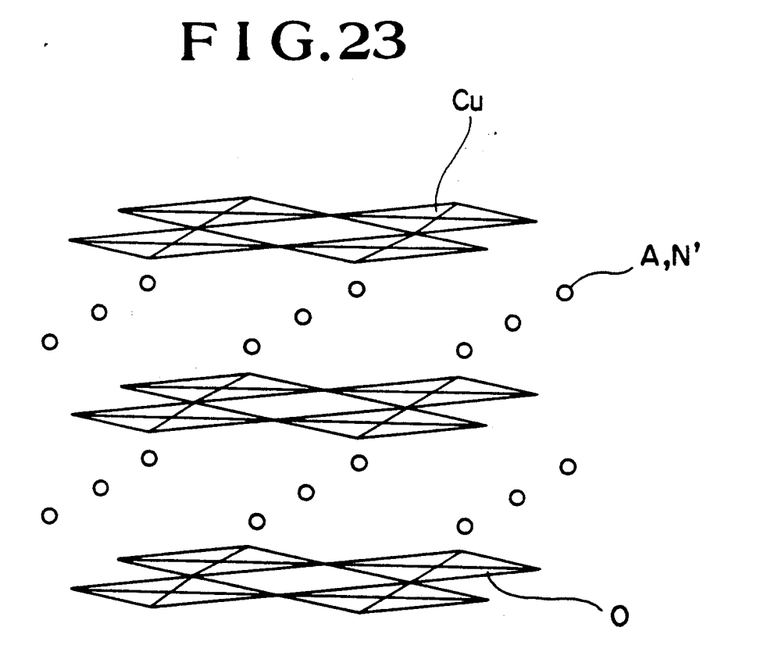
FIG. 23 is a schematic diagram showing the fundament crystal structure of another oxide superconductor according to the present invention.
Figure 24:
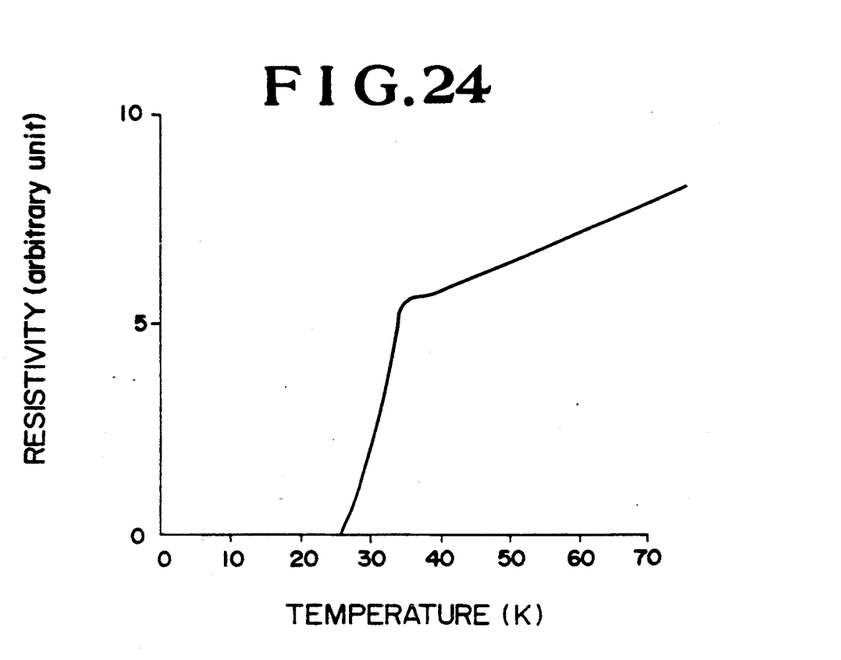
FIG. 24 is a graph showing the temperature-resistivity characteristic of the oxide superconductor of FIG. 23.

Explanation will be made of an oxide superconductor according to the nineteenth embodiment of the present invention, with reference to FIGS. 23 and 24. The oxide superconductor is produced in the following manner.

At first, 36 g of calcium carbonate ($CaCO_3$) powder, 10.3 g of strontium carbonate ($SrCO_3$) powder, 7.9 g of yttrium oxide ($Y_2O_3$) powder and 39.8 g of cupric oxide ($CuO$) powder are mixed. The mixture is heated in air at 960° C. for eight hours. The compound thus obtained is pulverized, mixed by stirring, and then pressed to a tablet. The tablet is baked in an atmosphere of argon (Ar) at 800° C. for 12 hours, to reduce the compound, thereby obtaining an oxide superconductor which has a composition expressed by a chemical formula $Ca_{0.72}Y_{0.14}Sr_{014}CuOy$. FIGS. 23 and 24 show the crystal structure and temperature vs resistvity characteristic of the oxide superconductor, respectively.

Various oxide superconductors shown in the following table were produced, and it was confirmed that these superconductors had substantially the same characteristic as in the above oxide superconductor.

|  | composition | powder | | | synthesis temperature °C. | baking temperature °C. |
|---|---|---|---|---|---|---|
| 1 | $Sr_{1.85}La_{0.15}CuOy$ | $SrCO_3$ | $La_2O_3$ | $CuO$ | 980 | 800 |
| 2 | $Sr_{1.85}Ce_{0.15}CuOy$ | $SrCO_3$ | $CeO_2$ | $CuO$ | 1000 | 800 |
| 3 | $Sr_{1.85}Nd_{0.15}CuOy$ | $SrCO_3$ | $Nd_2O_3$ | $CuO$ | 990 | 800 |
| 4 | $Sr_{1.85}Pb_{0.15}CuOy$ | $SrCO_3$ | $PbO$ | $CuO$ | 920 | 800 |
| 5 | $Sr_{1.85}Bi_{0.15}CuOy$ | $SrCO_3$ | $Bi_2O_3$ | $CuO$ | 920 | 800 |
| 6 | $Sr_{1.85}Tl_{0.15}CuOy$ | $SrCO_3$ | $Tl_2O_3$ | $CuO$ | 920 | 800 |
| 7 | $Ca_{1.85}La_{0.15}CuOy$ | $CaCO_3$ | $La_2O_3$ | $CuO$ | 970 | 800 |
| 8 | $Ca_{1.85}Ce_{0.15}CuOy$ | $CaCO_3$ | $CeO_2$ | $CuO$ | 1000 | 800 |
| 9 | $Ca_{1.85}Nd_{0.15}CuOy$ | $CaCO_3$ | $Nd_2O_3$ | $CuO$ | 980 | 800 |
| 10 | $Ca_{1.85}Tl_{0.15}CuOy$ | $CaCO_3$ | $Tl_2O_3$ | $CuO$ | 910 | 800 |
| 11 | $Ca_{1.85}Pb_{0.15}CuOy$ | $CaCO_3$ | $PbO$ | $CuO$ | 910 | 800 |
| 12 | $Ca_{1.85}Bi_{0.15}CuOy$ | $CaCO_3$ | $Bi_2O_3$ | $CuO$ | 920 | 800 |

Further, the following materials similar to the above oxide superconductors can also be used as superconductors.

$Sr_{1.85}Pr_{0.15}CuOy$, $Sr_{1.85}Sm_{0.15}CuOy$, $Sr_{1.85}Gd_{0.15}CuOy$
$Sr_{1.85}Tb_{0.15}CuOy$, $Sr_{1.85}In_{0.15}CuOy$, $Ca_{1.85}Pb_{0.15}CuOy$
$Ca_{1.85}Sm_{0.15}CuOy$, $Ca_{1.85}Gd_{0.15}CuOy$, $Ca_{1.85}Tb_{0.15}CuOy$
$Sr_{1.85}In_{0.15}CuOy$, $Ca_{1.85}In_{0.15}CuOy$, $Sr_{1.85}Y_{0.15}CuOy$
$Ca_{1.85}Y_{0.15}CuOy$, $Sr_{1.45}Ca_{0.40}La_{0.15}CuOy$,
$Sr_{0.45}Ca_{1.40}Hd_{0.15}CuOy$, $Sr_{1.40}Ca_{0.45}Bi_{0.15}CuOy$
$Sr_{1.45}Ca_{0.40}Tl_{0.15}CuOy$
$Sr_{1.8}La_{0.2}CuOy$, $Ca_{1.95}Nd_{0.05}CuOy$, $Ca_{1.6}Bi_{0.4}CuOy$

We claim:

1. An oxide superconductor having a composition expressed by a chemical formula $Ln_{2-x}M_xCuOy$, where Ln indicates at least one element selected from a group consisting of Pr, Nd, Pm, Sm, Eu, Gd, and Er, wherein M is limited to Th and $3.5 \leq y \leq$.

2. An oxide superconductor according to claim 1, wherein x lies in a range from 0.05 to 0.4.

3. An oxide superconductor according to claim 2, wherein x lies in a range from 0.15 to 0.2.

* * * * *

UNITED STATES PATENT AND TRADEMARK OFFICE
CERTIFICATE OF CORRECTION

PATENT NO. : 5,151,409  Page 1 of 2
DATED : 29 September 1992
INVENTOR(S) : Masahiko HIRATANI et al It is certified that error appears in the above-indentified patent and that said Letters Patent is hereby corrected as shown below:

| Column | Line | |
|---|---|---|
| 1 | 16 | Change "indirect" to --in direct--. |
| 1 | 55 | Change "Junction" to --junction--. |
| 1 | 57 | Change "aroused" to --caused--. |
| 2 | 8 | Change "are aroused by" to --result from--. |
| 3 | 11 | Change "than" to --thin--. |
| 4 | 65 | Change "thim" to --thin--. |
| 6 | 5 | After "superconductors" insert --,--. |
| 6 | 53 | Before "exciton" insert --an--. |
| 6 | 67 | After "phenomenon" change "is" to --was--. |
| 8 | 59 | Change "ment" to --mental--. |
| 13 | 48 | After "crystal" insert --.--. |
| 14 | 7 | After "electrode" insert --6--. |
| 15 | 35 | Delete "is formed" (second occurrence). |
| 15 | 41 | Change ") formed" to --), is formed--. |
| 17 | 8 | Change "tansistor" to --transistor--. |
| 18 | 18 | Change "p-suercon-" to -- p-supercon- --. |
| 19 | 45 | Change "$Nd_{1.85}Tl_{.07}CuOy.$" to --$Nd_{1.85}Tl_{0.08}Pb_{0.07}CuOy.$--. |

UNITED STATES PATENT AND TRADEMARK OFFICE
CERTIFICATE OF CORRECTION

PATENT NO. : 5,151,409
DATED : 29 September 1992
INVENTOR(S) : Masahiko HIRATANI et al It is certified that error appears in the above-indentified patent and that said Letters Patent is hereby corrected as shown below:

| Column | Line | |
|---|---|---|
| 20 | 9 | Change "$Sr_{014}$" to --$Sr_{0.14}$--. |
| 20 | 44 | Change "$Hd_{0.15}$" to --$Nd_{0.15}$--. |
| 20 | 51 | Before "wherein" insert --and--. |
| 20 | 52 | After "$y \leq$" insert --4--. |

Signed and Sealed this

Twenty-fifth Day of January, 1994

Attest:

BRUCE LEHMAN

Attesting Officer      Commissioner of Patents and Trademarks